United States Patent
Tu et al.

(10) Patent No.: US 11,870,574 B1
(45) Date of Patent: *Jan. 9, 2024

(54) LPWAN COMMUNICATION PROTOCOL DESIGN WITH TURBO CODES

(71) Applicant: STAR ALLY INTERNATIONAL LIMITED, Tortola (VG)

(72) Inventors: Wenwen Tu, Santa Clara, CA (US); Wensheng Hua, Fremont, CA (US)

(73) Assignee: STAR ALLY INTERNATIONAL LIMITED, Tortola (VG)

( * ) Notice: Subject to any disclaimer, the term of this patent is extended or adjusted under 35 U.S.C. 154(b) by 0 days.

This patent is subject to a terminal disclaimer.

(21) Appl. No.: 17/939,894

(22) Filed: Sep. 7, 2022

Related U.S. Application Data

(63) Continuation of application No. 16/661,462, filed on Oct. 23, 2019, now abandoned.

(60) Provisional application No. 62/749,793, filed on Oct. 24, 2018.

(51) Int. Cl.
*H04L 1/00* (2006.01)

(52) U.S. Cl.
CPC .......... *H04L 1/0059* (2013.01); *H04L 1/0061* (2013.01)

(58) Field of Classification Search
None
See application file for complete search history.

(56) References Cited

U.S. PATENT DOCUMENTS

| | | |
|---|---|---|
| 7,215,721 B2 | 5/2007 | Hietala et al. |
| 7,260,766 B2 | 8/2007 | Levy et al. |
| 2003/0028838 A1 | 2/2003 | Chang et al. |
| 2004/0010743 A1 | 1/2004 | Lee et al. |
| 2005/0289429 A1 | 12/2005 | Bottomley et al. |
| 2006/0059402 A1 | 3/2006 | Dominique et al. |
| 2013/0007568 A1 | 1/2013 | Okamura |
| 2013/0019144 A1 | 1/2013 | Harata et al. |
| 2014/0126507 A1 | 5/2014 | Takahashi et al. |
| 2014/0153625 A1 | 6/2014 | Vojcic et al. |
| 2016/0036468 A1 | 2/2016 | Eckert et al. |

(Continued)

FOREIGN PATENT DOCUMENTS

| | | |
|---|---|---|
| EP | 1221772 A2 | 7/2002 |

OTHER PUBLICATIONS

"PCT Search Report and Written Opinion, PCT/US2019/057621", dated Jan. 13, 2020.

(Continued)

*Primary Examiner* — Guerrier Merant
(74) *Attorney, Agent, or Firm* — Edward C. Kwok; VLP Law Group LLP

(57) ABSTRACT

A method and a decoder for receiving a message encoded in Turbo Codes and modulated for transmission as an analog signal includes: (a) demodulating the analog signal to recover the Turbo Codes; and (b) decoding the Turbo Codes to recover the message using an iterative Turbo Code decoder, wherein the decoding includes performing an error detection after a predetermined number of iterations of the Turbo Code decoder to determine whether or not an error has occurred during the transmission. The predetermined number of iterations may be, for example, two. Depending on the result of the error detection, the decoding may stop, a request for retransmission of the message may be sent, or further iterations of decoding in the Turbo Code decoder may be carried out.

27 Claims, 7 Drawing Sheets

(56) References Cited

U.S. PATENT DOCUMENTS

2016/0119931 A1   4/2016   Soriaga et al.
2016/0277096 A1   9/2016   Wu et al.

OTHER PUBLICATIONS

Roth, Yoann, et al., "Turbo-FSK, a Physical Layer for Low-power Wide-area Networks: Analysis and Optimization", Comptes Rendus Physique vol. 18, Issue 2, Feb. 2017, pp. 178-188.

| Iteration number | 1 | 2 | 3 | 4 | 5 | 6 | 7 | 8 | 9 |
|---|---|---|---|---|---|---|---|---|---|
| Error number | 34035 | 672 | 337 | 257 | 220 | 212 | 205 | 202 | 202 |
| Error rate/$10^{-5}$ | 170.175 | 3.36 | 1.685 | 1.285 | 1.1 | 1.06 | 1.025 | 1.01 | 1.01 |
| CRC detected number | 34024 | 672 | 337 | 257 | 220 | 212 | 205 | 202 | 202 |
| Error rate after CRC/$10^{-7}$ | 5.5 | ≤1 | ≤1 | ≤1 | ≤1 | ≤1 | ≤1 | ≤1 | ≤1 |

| Iteration number | 10 | 11 | 12 | 13 | 14 | 15 | 16 | 17 | 18 |
|---|---|---|---|---|---|---|---|---|---|
| Error number | 199 | 196 | 195 | 195 | 194 | 194 | 194 | 194 | 194 |
| Error rate/$10^{-5}$ | 0.995 | 0.98 | 0.975 | 0.975 | 0.97 | 0.97 | 0.97 | 0.97 | 0.97 |
| CRC detected number | 199 | 196 | 195 | 195 | 194 | 194 | 194 | 194 | 194 |
| Error rate after CRC/$10^{-7}$ | ≤1 | ≤1 | ≤1 | ≤1 | ≤1 | ≤1 | ≤1 | ≤1 | ≤1 |

*FIG. 7*

LPWAN COMMUNICATION PROTOCOL DESIGN WITH TURBO CODES

CROSS REFERENCE TO RELATED APPLICATIONS

The present application is a continuation application of U.S. patent application Ser. No. 16/661,462, entitled "LPWAN Communication Protocol Design With Turbo Codes," filed on Oct. 23, 2019, which claims priority of U.S. provisional application serial no. 62/749,793, entitled "LPWAN Communication Protocol Design With Turbo Codes," filed on Oct. 24, 2018.

BACKGROUND OF THE INVENTION

1. Field of the Invention

The present invention relates to communication protocols. In particular, the present invention relates to communication protocols that are suitable for use in wireless communication applications, such as Low-Power Wide-Area Networks (LP-WANs).

2. Discussion of the Related Art

FIG. 1 shows model 100 of a communication system. As shown in FIG. 1, binary data 101 is encoded into a sequence of binary code words at step 102. Examples of encoding include error detecting codes, error correction codes and turbo codes. In the detailed description below, an encoding scheme that uses turbo codes, or any of several selected types of error detecting codes, illustrates the present invention. The encoded sequence of binary code words is modulated at step 103 onto a carrier signal for transmission at step 104. One example of a modulation scheme may be code division multi-access (CDMA), combined with either quadrature phase-shift keying (QPSK) modulation or binary phase-shift keying (BPS K) modulation. The modulated signal may be transmitted over a noisy communication channel and received at a receiver at step 106.

At step 107, the receiver demodulates the signal received from the communication channel to recover the encoded signal, which is then decoded at step 108 to recover binary data 109. An error that occurs along the signal path represented by steps 102-107 may cause binary data 109 and binary data 101 to be different.

In communication model 100, noise in the communication channel between transmission at step 106 and reception at step 107 may be modeled by a Gaussian noise model ("Gaussian channel"). In some instances, modulation step 105 and demodulation step 107 may be lumped for the purpose of analysis into the communication channel ("binary channel").

In this detailed description, embodiments of the present invention are described using a CDMA modulation scheme, which may be characterized by the carrier frequency fo and the number of chips (i.e., bits) N in the code assigned to a signal source. The noise in the Gaussian channel under a CDMA modulation scheme may be characterized by a signal-to-noise ratio (SNR) defined as:

$$SNR = 10^{\frac{\phi}{10}} \times \frac{N}{f_0}$$

where $\phi$ represents a modulation scheme-independent noise measured expressed in dB Hz. The Gaussian channel has a channel capacity $C_g$ defined as:

$$C_g = \min_N C_S(N, \phi)$$

where $C_s(N,\phi)$ is defined as:

$$C_S(N, \phi) = \frac{f_0}{2N} \log\left(1 + 10^{\frac{\phi}{10}} \times \frac{N}{f_0}\right)$$

For a sufficiently small $$10^{\frac{\phi}{10}} \times \frac{N}{f_0},$$

$$C_g \approx \frac{1}{2\ln 2} 10^{\frac{\phi}{10}}$$

Similarly, the binary channel has a capacity $C_g$ defined as:

$$C_B = \min_N \frac{f_0}{N} C_b(N, \phi)$$

where $C_b(N, \phi)$ is the greatest coding rate achieved in an optimal coding scheme, defined as:

$C_b = 1 + p \log p + (1-p)\log(1-p)$, where p is the probability that a bit in a transmitted code word is flipped, given by:

$$p = \frac{1}{2}\left(1 - \text{erf}\left(\frac{1}{\sigma\sqrt{2}}\right)\right)$$

with $$\text{erf}(x) = \frac{1}{\sqrt{\pi}} \int_{-x}^{x} e^{-t^2} dt, \text{ and}$$

$$\sigma = \frac{1}{\sqrt{SNR}} = 10^{\frac{-\phi}{20} \times \frac{N}{f_0}}$$

The information transmit rate and the decoding energy are two figures of merit that are often used in the analysis of a communication channel. It is desirable to have a high information transmit rate, while keeping the decoding energy low.

Suppose an encoded message frame of length K, resulting from encoding rK bits of information (r being the "information rate," typically less than 1.0) is provided for transmission. The additional bits under the encoding scheme enable error detection, error correction, or both. Suppose further that the message frame is transmitted using a CDMA modulation scheme with a channel coding rate η (i.e., the K-bit message frame is encoded into a K/η-bit blocks for transmission), and the communication channel has an error rate $P_{er}$ per block, the effective information rate R is given by:

$$R = \frac{\eta f_0 (1 - P_{er}) r}{N}$$

The decoding energy per information bit is given by:

$$E = \eta E_0(\eta) \frac{f_0}{N}$$

for small $P_{er}$, where $E_0(\eta)$ is the computational energy per input bit.

The "Turbo code" encoding scheme is illustrated by Turbo Code encoder 200 of FIG. 2a. As shown in FIG. 2a, Turbo Code encoder 200 receives an input sequence $\{d_k\}$ to provide an output sequence $\{X_k, Y_k\}$, where $X_k$ reproduces sequence $\{d_k\}$ and $Y_k$ is the concatenation of two subsequences, $Y_{1k}$ and $Y_{2k}$. The output sequence is then transmitted. In FIG. 2a, subsequences $Y_{1k}$ and $Y_{2k}$ are recursive systematic convolutions (RSC) codes. In the example of FIG. 2a, RSC encoders 201a and 201b each include 4 unit-delay shift registers and both implement the finite state machine:

$$h(x) = \frac{1 + D^4 x}{1 + Dx + D^2 x + D^3 x + D^4 x}$$

Delay line 202 delays sequence $\{d_k\}$ by 5 bits, so that both RSC encoders 201a and 201b operate on the same set of input bits. Interleaver 203 permutates the delayed sequence at RSC encoder 201b before coding. Permutating the input sequence provides higher performance in the presence of burst noise in the communication channel. In this example, the coding rate is nominally ⅓, as the nominal coding rate is $$\frac{1}{(1 + n)},$$

where n is the number of RSC codes. In some embodiments, a predetermined number of bits may be removed ("punctured") from subsequences $Y_{1k}$ and $Y_{2k}$, so as to achieve a higher coding rate. In some embodiments, additional RSC encoders may be provided for greater noise immunity. Turbo Codes have been shown to achieve a channel capacity that is closest to the theoretical Shannon limit.

FIG. 2b shows schematically exemplary Turbo Code decoder 250 for decoding turbo codes that are generated from Turbo Code encoder 200. As shown in FIG. 2b, Turbo Code decoder 250 includes two decoders 251a and 251b, each of which may be a BCJR decoder, as known to those of ordinary skill in the art. Each decoder provides an output value $\Lambda(d_k)$, computed based on input bit $x_k$, $y_k$, and $\Lambda(d'_k)$, where $x_k$ and $y_k$ are corresponding received bits from transmitted sequence $\{X_k, Y_k\}$ and $\kappa(d'_k)$ is a previous computed output value from decoding the same $x_k$ and $y_k$. In FIG. 2b, decoder 251a operates on $x_k$ and $y_{ik}$ and the preceding output value of decoder 251b from the previous iteration, and decoder 251b operate on $x_k$ and $y_{1k}$ and the output value of decoder 251a in the current iteration. In the example of FIG. 2b, $\kappa(d_k)$ may be the log likelihood ratio:

$$\Lambda(d_k) = \log \frac{p(d_k = 1)}{p(d_k = 0)}$$

Using the BJCR algorithm, known to those of ordinary skill in the art, one of the probabilities $p(d_k=1)$ and $p(d_k=0)$ increases while the other decreases with the number of iterations. The number of iterations necessary to achieve a given error bit rate can be determined empirically for a communication channel. After the requisite number of iterations, the sign of $\Lambda(d_k)$ can be used to determine if the decoded bit is '1' (positive $\Lambda(d_k)$) or '0' (negative $\kappa(d_k)$).

While the complexity of Turbo Code encoding grows linearly with both the coding rate and the number of unit delay elements in the RSC code encoder, the complexity of Turbo Code decoding grows exponentially with the number of unit delay elements in the RSC code encoder. For this reason, in practical applications, the number of unit delay elements in the RSC code encoder seldom exceeds 4. Furthermore, for many applications, it is not uncommon to find that the number of required decoding iterations exceeds 10 to achieve an acceptable bit error rate, resulting in a long decoding latency. Therefore, it is long desired to provide an encoding and decoding scheme that achieves the near-Shannon capacity of Turbo codes, while having a shorter decoding latency.

SUMMARY OF THE INVENTION

According to one embodiment of the present invention, a decoder and a method for receiving a message encoded in Turbo Codes and modulated for transmission as an analog signal are provided. The method includes: (a) demodulating the analog signal to recover the Turbo Codes; and (b) decoding the Turbo Codes to recover the message using an iterative Turbo Code decoder, wherein the decoding includes performing an error detection after a predetermined number of iterations of the Turbo Code decoder to determine whether or not an error has occurred during the transmission. The predetermined number of iterations may be, for example, two. When the error detection determines that an error has likely not occurred during the transmission, the decoding may stop. Such an error detection may include, for example, (i) computing the RSC codes from the decoded message portion of the Turbo Codes, and (ii) evaluating the computed RSC codes against the decoded RSC codes portion. When the error detection determines that an error has occurred during the transmission, a request for retransmission of the message may be sent or, alternatively, one or more further iterations of decoding in the Turbo Code decoder may be carried out.

According to one embodiment of the present invention, the error detection step may include evaluating an indicator which provides a probability that an error has occurred during the transmission. The analog signal may be transmitted at one of a plurality of analog values (e.g., 1.0 and −1.0). The error detection may involve evaluating a probability $P(Y_i - X_i | X_i)$, which is the probability of receiving, for the i-th bit of a Turbo Code block an analog value $Y_i$, given a transmitted analog signal $X_i$. In one implementation using a binary modulation scheme, in which the values $X_i$ and $\overline{X}_i$ are the analog representations of complementary binary values '1' and '0', one may calculate an indicator of error occurrence during transmission using the expression:

$$\frac{-1}{L}\sum_{i=1}^{L}\log\frac{P(Y_i - X_i \mid X_i)}{P(Y_i - X_i \mid X_i) + P(Y_i - \overline{X_i} \mid \overline{X_i})}$$

where L is a length in number of bits of the Turbo Code block.

Alternatively, or in addition to evaluating the indicator, the Turbo Code block encodes an error detection code word (e.g., a cyclic redundancy check (CRC) code word), which is recovered by Turbo Code decoding. After a predetermined number of iterations, the data portion of the decoded Turbo Codes is decoded by an appropriate error detection code decoder (e.g., a CRC decoder). Successful decoding by the error detection code decoder provides an error detection.

The present invention is better understood upon consideration of the detailed description below in conjunction with the accompanying drawings.

BRIEF DESCRIPTION OF THE DRAWINGS

FIG. 7 shows in table form the simulation results of communication using a Turbo Codes encoding scheme, with error detection by CRC included, over a Gaussian channel.

DETAILED DESCRIPTION OF THE PREFERRED EMBODIMENTS

Certain encoding scheme, such as Turbo Codes, do not have an error detection capability. The present invention provides an error detection ability to a Turbo Code-based communication scheme.

According to one embodiment of the present invention, one may design an indicator that, when evaluated from the received modulated signal, can be used to determine to some level of confidence that a transmitted signal is correctly received. For example, suppose an analog value Y is received from modulated analog value $X_i$ (which may be either −1.0 or +1.0, inclusive) for the i-th bit of a transmitted message block. The modulation may be, for example, a CDMA in conjunction with a phase shift key modulation scheme. For a Gaussian channel, the probability received signal Y deviates from the mean of the transmitted value $X_i$, $P(Y_i - X_i \mid X_i)$, has a Gaussian distribution, which can be empirically obtained. Furthermore, for binary values transmitted over a Gaussian channel, the probability that the i-th bit of a message block of length L has the received value $Y_i$, as a result of the value being transmitted as $X_i$, is given by:

$$\frac{P(Y_i - X_i \mid X_i)}{P(Y_i - X_i \mid X_i) + P(Y_i - \overline{X_i} \mid \overline{X_i})},$$

for l=1, 2, . . . , L. This probability for each bit is independent from the same probability for any of the other bits in the message block, although they have the same probability distribution. This probability may be interpreted to represent the probability that the i-th bit of the message block, having value $X_i$, is correctly received. Because of their independence, the log probability that all bits of the message block are correctly received is related to:

$$\sum_{i=1}^{L}\log\frac{P(Y_i - X_i \mid X_i)}{P(Y_i - X_i \mid X_i) + P(Y_i - \overline{X_i} \mid \overline{X_i})}$$

For a sufficiently long message block (e.g., L≥40), this log probability may be estimated by variable S with a Gaussian distribution:

$$S = \frac{-1}{L}\sum_{i=1}^{L}\log\frac{P(Y_i - X_i \mid X_i)}{P(Y_i - X_i \mid X_i) + P(Y_i - \overline{X_i} \mid \overline{X_i})}$$

For a given message block, the amount the value of variable S deviates from its mean indicates the probability that one or more bits are incorrectly received. Thus, variable S may be used as an indicator that can serve as error detection.

Figure 1:
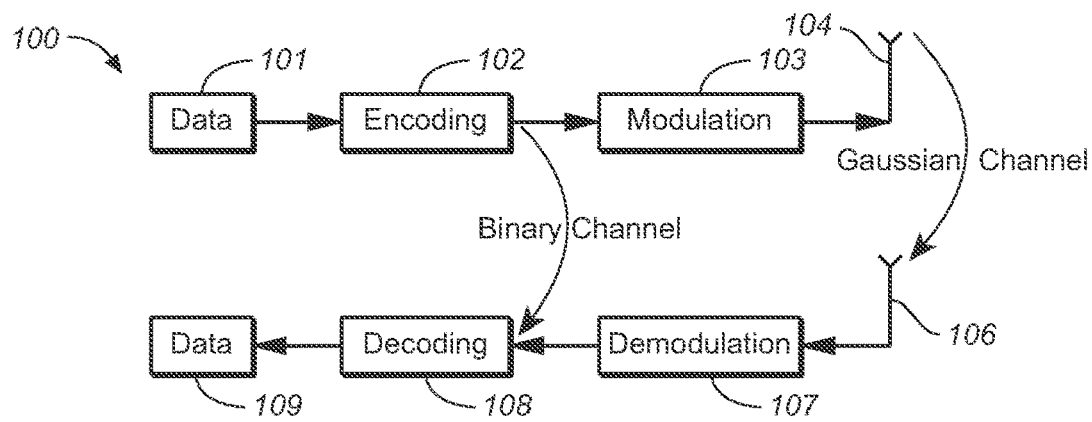
FIG. 1 shows model 100 of a communication system.
Figure 2A:
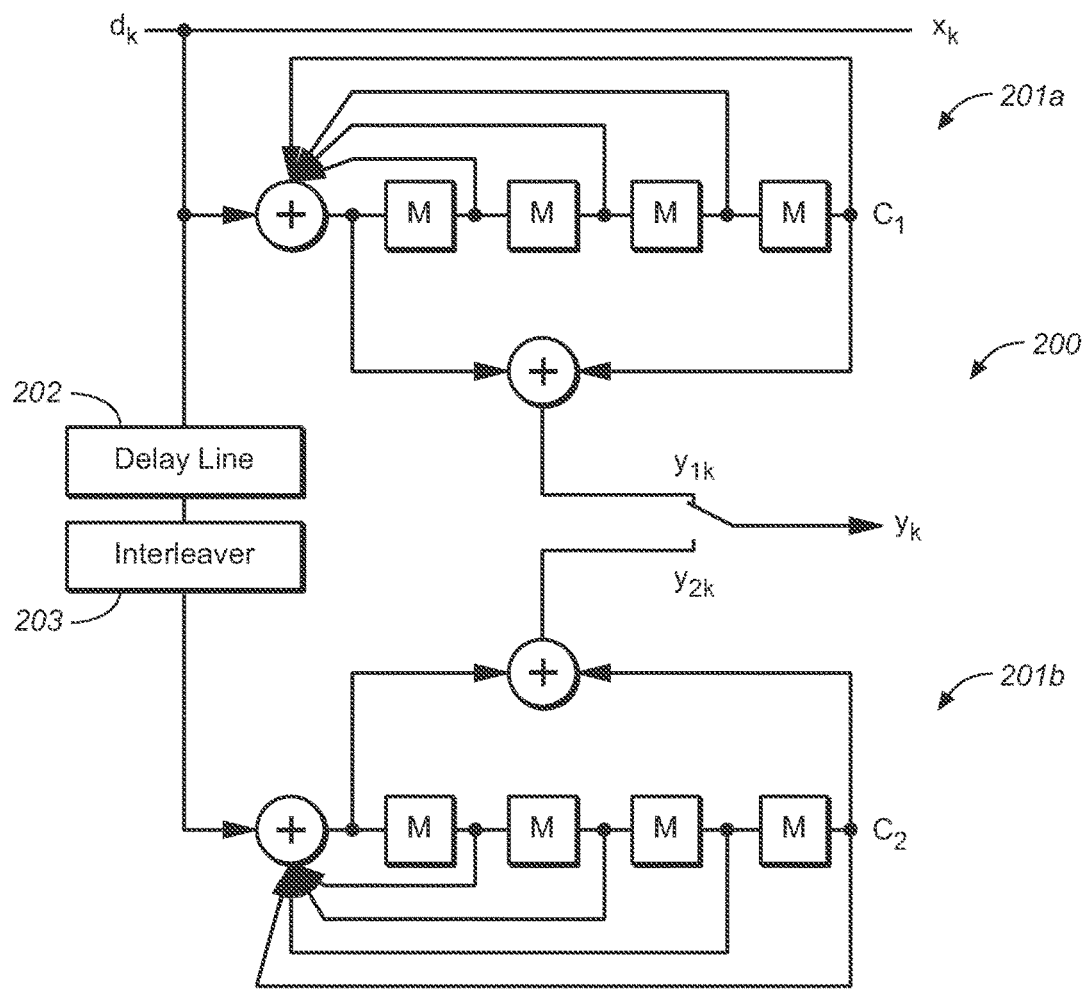
FIG. 2a shows schematically exemplary Turbo Code encoder 200.
Figure 2B:
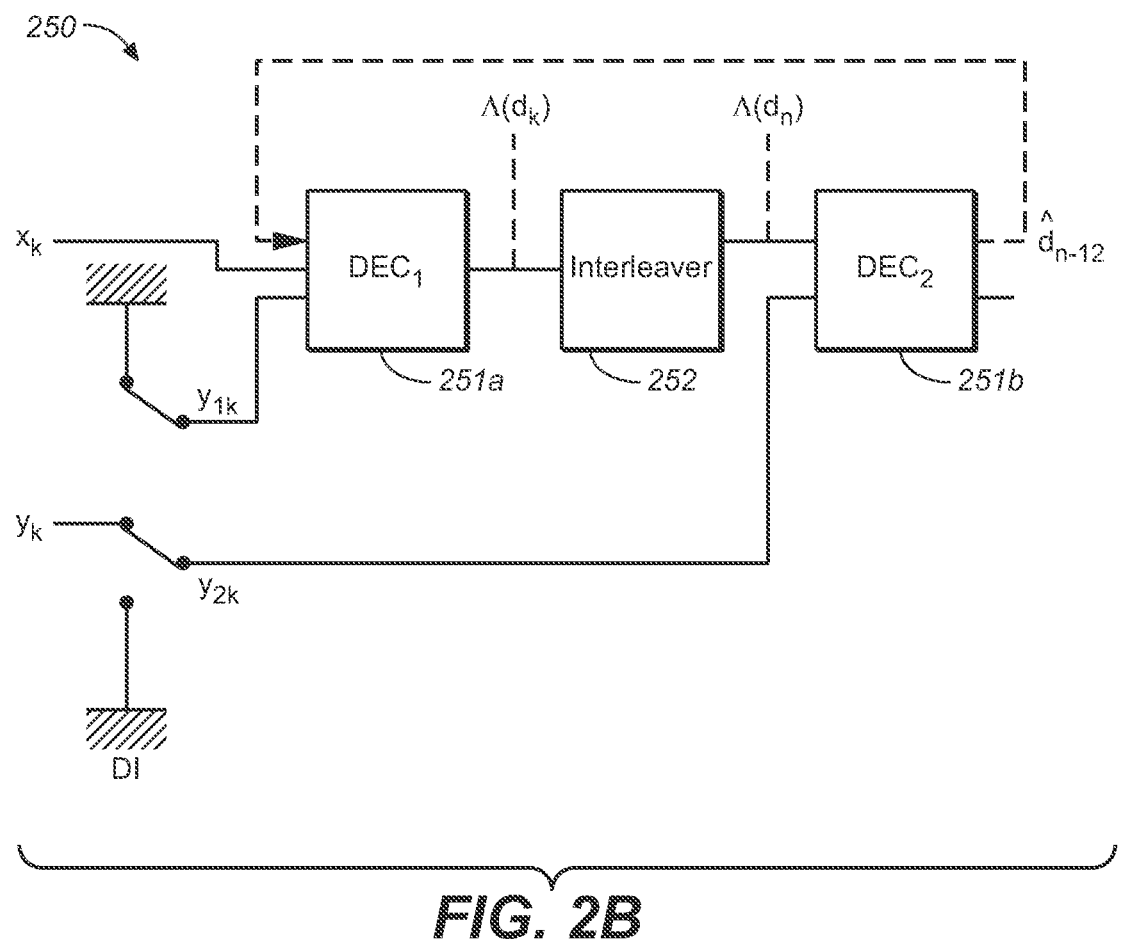
FIG. 2b shows schematically exemplary Turbo Code decoder 250.

In one embodiment of the present invention, in which the Turbo Code encoding scheme of FIG. 2a is used, the sequence of received analog values $\{Y_i\}$, i=1, 2, . . . L, are digitized to the sequence of binary values $\{\tilde{X}_i\}$. Sequence $\{\tilde{X}_i\}$ is then provided to a Turbo Code decoder for decoding over a predetermined number of iterations (e.g., 1) to obtain decoded binary sequence $\{\widetilde{d_k}, \widetilde{y_{1k}}, \widetilde{y_{2k}}\}$, in which $\widetilde{d_k}$ is the data portion of the Turbo Codes and $\widetilde{y_{1k}}, \widetilde{y_{2k}}$ are the RSC codes. The binary data sequence $\{\widetilde{d_k}\}$ is then provided to a Turbo Code encoder to replicate the Turbo Coding that occurred on the transmitter side prior to transmission. The Turbo Code encoder provides the sequence $\{\hat{X}_i\}$, which is $\{\widetilde{d_k}, \widehat{y_{1k}}, \widehat{y_{2k}}\}$, where $\widehat{y_{1k}}, \widehat{y_{2k}}$ are the computed RSC codes. $\{\hat{X}_i\}$ is then used to compute variable S and its deviation from the mean value $\overline{S}$ provides an indication that the sequence $\{\hat{X}_i\}$ is a correctly received message block.

Figure 3:
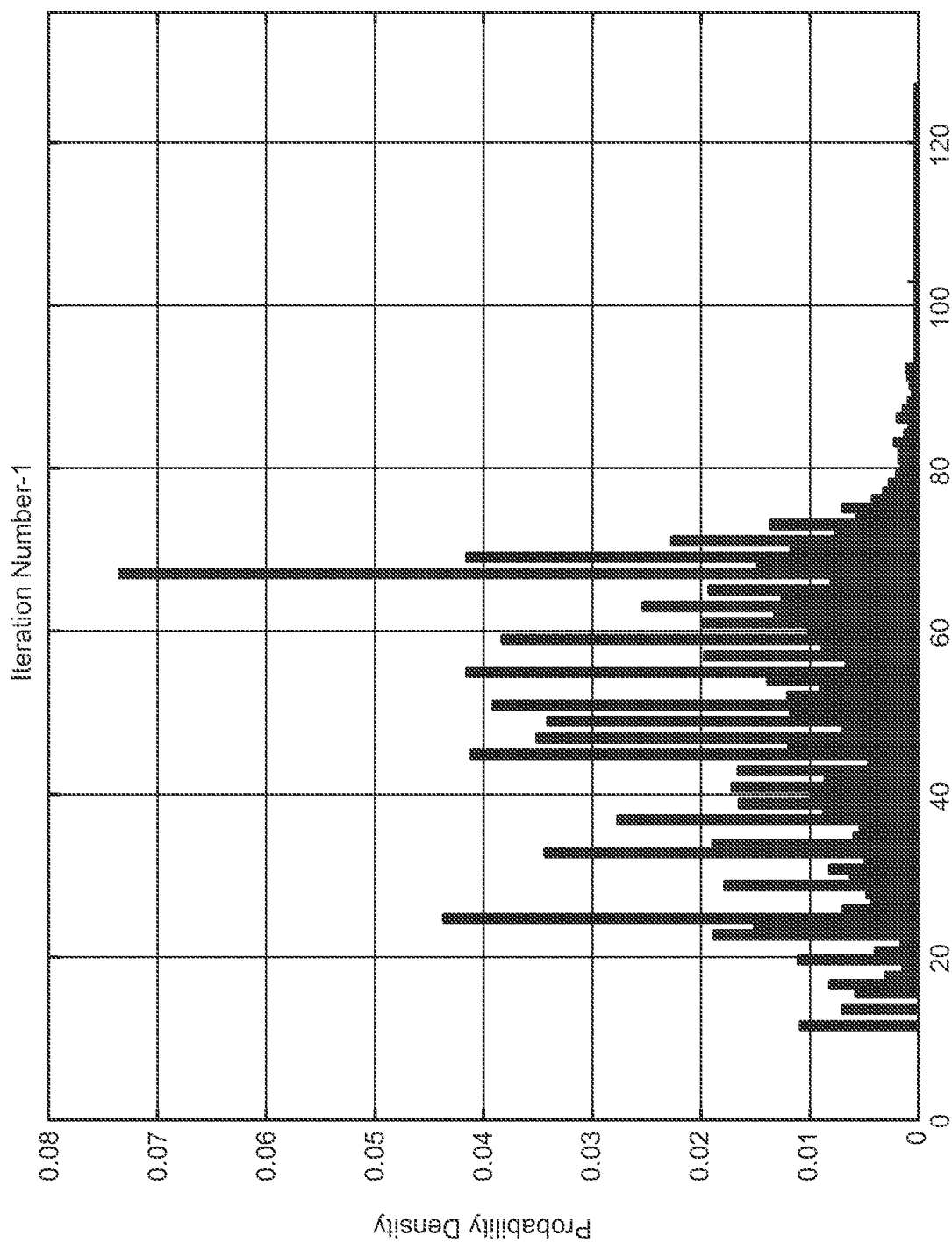
FIG. 3 shows the probability densities of bit errors per block for erroneous blocks after one iteration of Turbo Code decoding, in the results of a simulation of a Gaussian channel using $2 \times 10^7$ blocks of Turbo Codes, with each block having a 110-bit message frame (i.e., not including the RSC codes), at a coding rate of ⅓ and a signal-to-noise ratio of dBHz.
Figure 4:
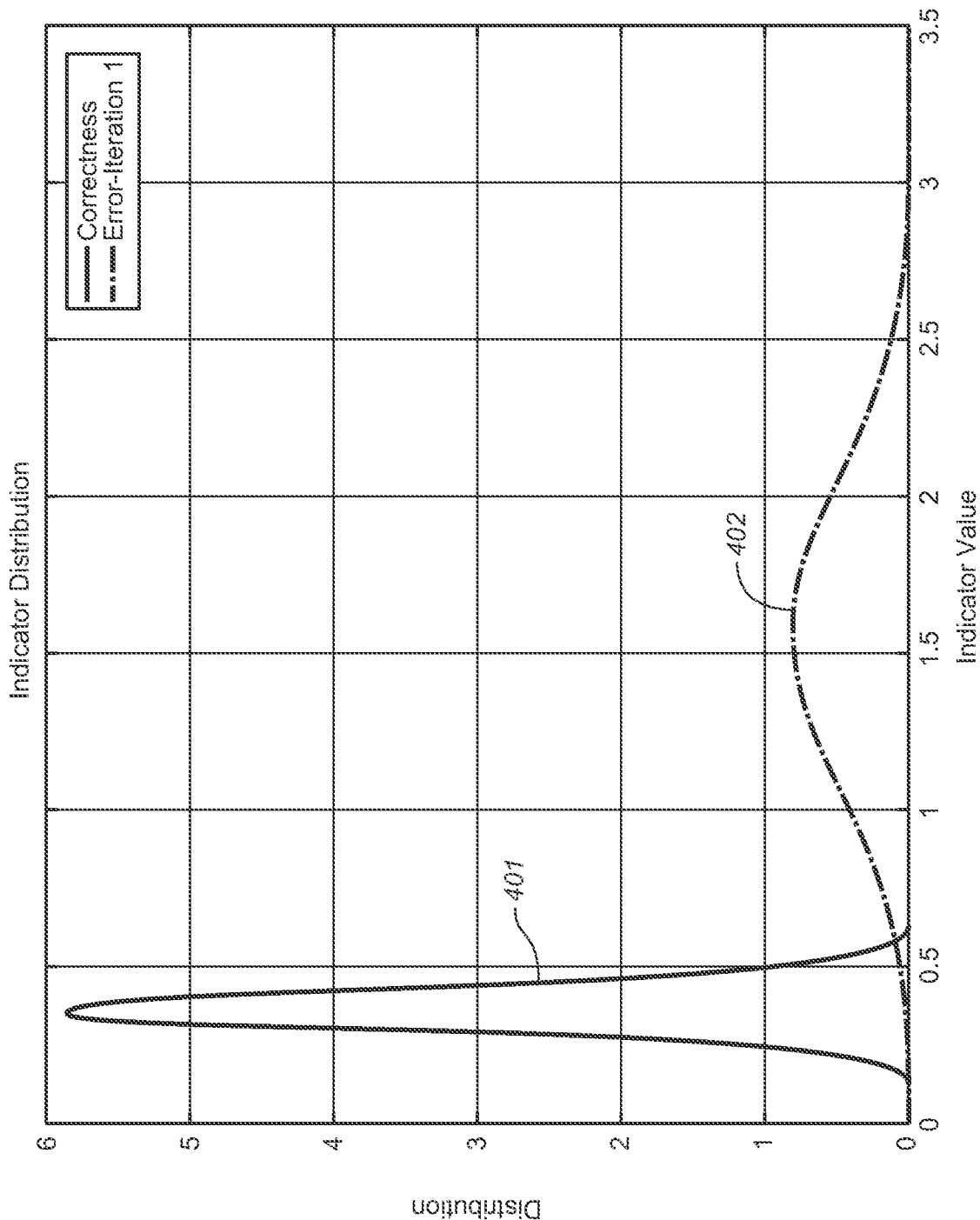
FIG. 4 shows the distributions of indicator values in decoded blocks without a flipped bit and in blocks found with one or more bits flipped, obtained based on the simulation of FIG. 3.

FIG. 3 shows the probability densities of bit errors per block in blocks with one or more errors found after one iteration of Turbo Code decoding in the results of a simulation of a Gaussian channel using $2 \times 10^7$ blocks of Turbo Codes, with each block having a 110-bit message frame (i.e., not including the RSC codes), at a coding rate of ⅓ and a signal-to-noise ratio of 30 dB Hz. The simulation assumes a 888-chip CDMA code and a carrier frequency at $10^8$. FIG. 4 shows the distributions of indicator values in decoded blocks without a flipped bit and in blocks found with one or more bits flipped, obtained based on the simulation of FIG.

3. In FIG. 4, the distribution of indicator values in blocks without a bit flipped is labeled 401 and the distribution of indicator values in blocks with one or more flipped bits is labeled 402. According to one embodiment of the present invention, a threshold value of the indicator may be selected to decide whether a Turbo Code decoded value should be accepted as correct ("positive") or not ("negative"), after a predetermined number of decoding iterations (e.g., one iteration). For example, based on the FIG. 5, one may select a value between 0.5 and 1.0, above which the Turbo Code decoding is accepted as incorrect and below which the Turbo Code decoding is accepted as correct.

Figure 5:
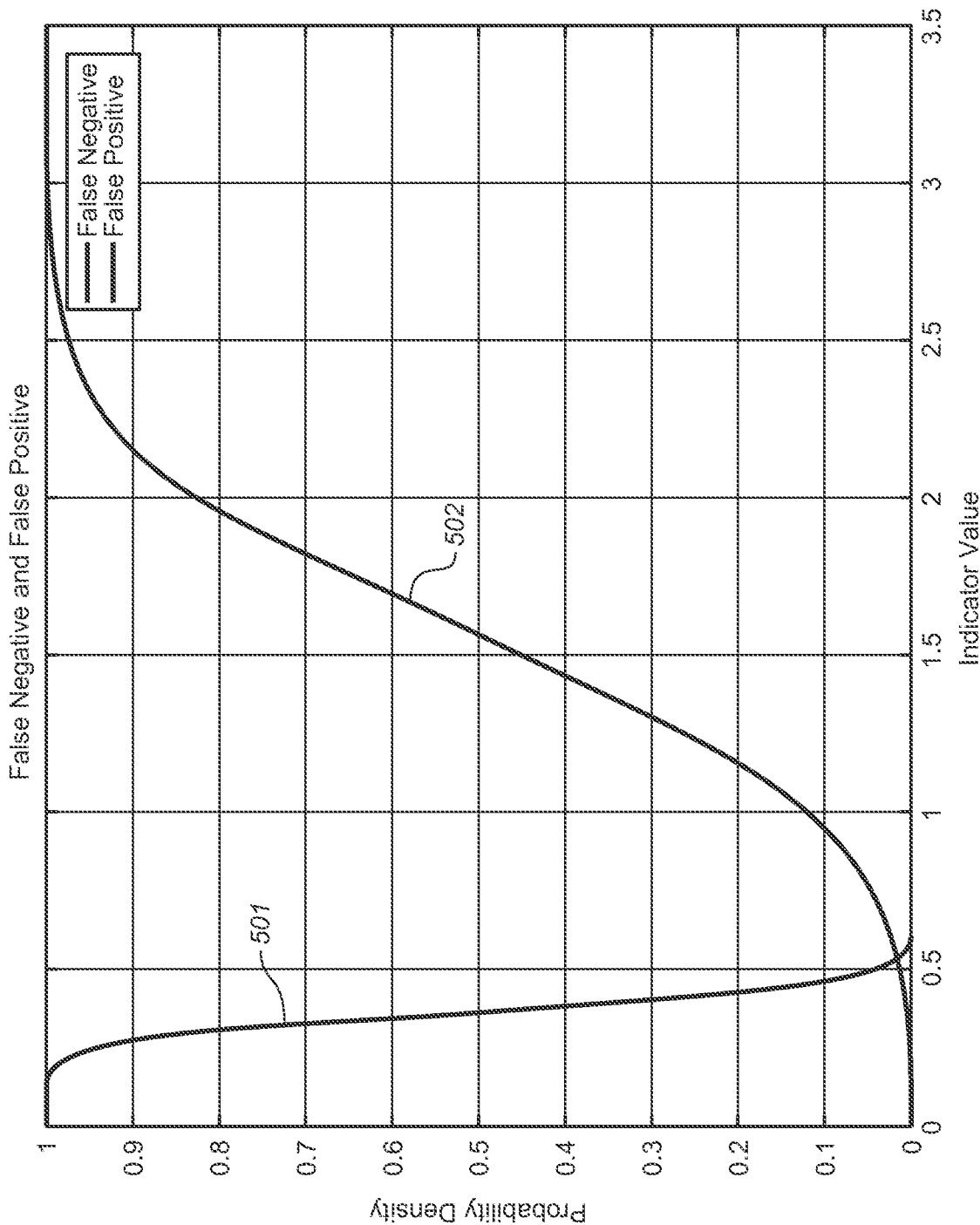
FIG. 5 shows probability density functions of a false negative determination (labeled 501) and of a false positive determination (labeled 502) for over the range of indicator threshold.

The indicator threshold thus should be selected to simultaneously contain both false positives (i.e., accepting as incorrect value as correct) or false negative (i.e., rejecting a correct value as incorrect). FIG. 5 shows probability density functions of a false negative determination (labeled 501) and of a false positive determination (labeled 502) for over the range of indicator threshold. Using the data in FIG. 6, for example, if one selects an indicator threshold of 0.533, the probability of a false negative determination for a given block is less than 1%, while the probability of a false positive determination is 1.637%.

When a block is rejected as incorrectly received based on the indicator, a decoder may send a resend request. Alternatively, if the communication protocol sends an acknowledgement for an accepted block, an unacknowledged block is automatically resent after a predetermined time period has elapsed.

Figure 6:
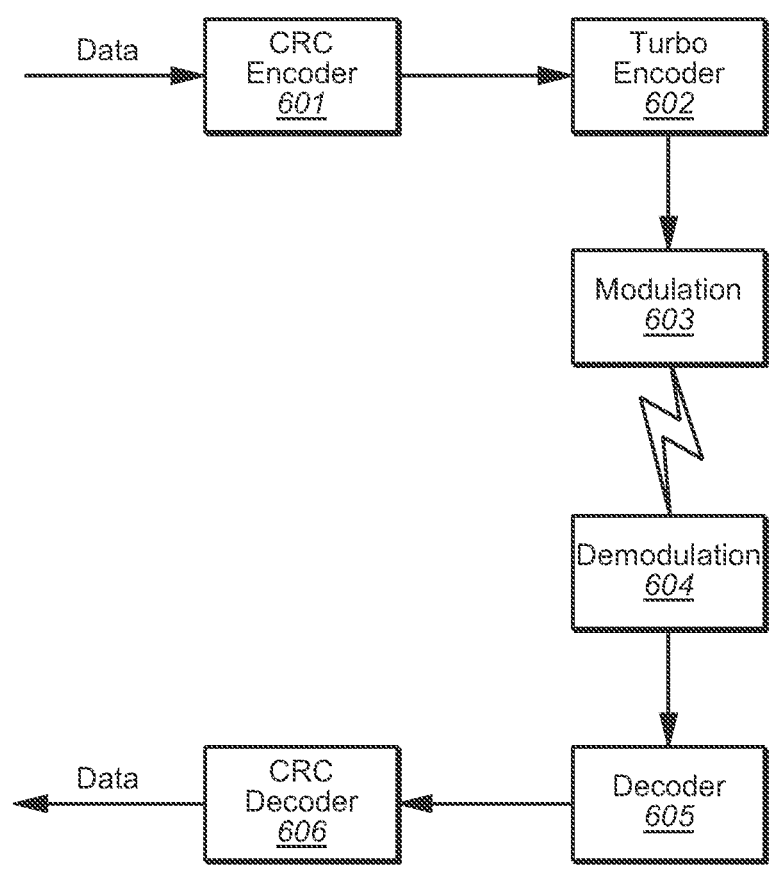
FIG. 6 shows a communication protocol that embeds an error detection capability in a transmitted message, while using a near-Shannon capacity Turbo Code encoding scheme, in accordance with one embodiment of the present invention.

According to one embodiment of the present invention and as illustrated in FIG. 6, prior to a block of data is encoded into Turbo Codes, the data may first be encoded using a cyclic redundancy check (CRC) encoding scheme (step 601). The CRC-encoded data is then additionally encoded into Turbo Codes (step 602). The Turbo Codes are then modulated and transmitted over the communication channel (step 603). The received signal is first demodulated (steep 604) and decoded in a Turbo Code decoder (step 605). Each iteration of the Turbo Code decoder yields a CRC-encoded data portion and the RSC codes. The CRC-encoded data portion may then be provided to a CRC decoder to recover the original data block (step 606). If the CRC-encoded data portion is successfully decoded, one may conclude that no further Turbo Code decoding iteration is required. However, if the CRC-decoding is not successful, one may conclude that an error may have occurred during transmission or that further iterations of the Turbo Code decoding may be required. At that point, one option may be to request a retransmit from the transmitting side, or to carry out one or more iterations of Turbo Code decoding to see the resulting CRC-encoded data portion can be successfully CRC-decoded.

FIG. 7 shows in table form the simulation results of communication using a Turbo Codes encoding scheme, with error detection by CRC included, over a Gaussian channel. As in the simulation of FIG. 3, the simulation in FIG. 7 uses $2 \times 10^7$ blocks of Turbo Codes, with each block having 110 bits compose of a 100-bit message frame and CRC parity bits, encoded at a coding rate of $\frac{1}{3}$ and a signal-to-noise ratio of 30 dB Hz. In this instance, the CRC-encoding has a generator polynomial given by:

$$g(x)=x^{10}+x^9+x^5+x^4+x+1$$

FIG. 7 lists in row order (i) the number of errors in the $2 \times 10^7$ blocks of Turbo Codes, (ii) the corresponding bit error rate, (iii) the number of errors detected by CRC decoding, and (iv) the error rate achieved by accepting a successful CRC-decoding, after each of Turbo Code decoding iterations 1-18 As shown in FIG. 7, 34035 blocks are shown to contain error bits after one iteration of Turbo Code decoding, thereby achieving a bit error rate of $1.70175 \times 10^{-3}$ bit error rate. However, 34024 of these errors are uncovered by CRC decoding after one iteration of Turbo Code decoding. Thus, the simulation in FIG. 7 shows that embedding the error detection capability of a CRC in Turbo Codes achieves in the example a bit error rate of $5.5 \times 10^{-7}$ after just one iteration of Turbo Code decoding. FIG. 7 shows that, if error detection by CRC is not used, the equivalent error rate is not achieve until after 10 iterations of Turbo Code decoding. Thus, embedding CRC error detection in Turbo Codes saves in this instance at least 9 iterations of Turbo Code decoding.

In fact, by combining error detection using the indicator with error detection using CRC codes, as taught above, a bit error rate of $9.0035 \times 10^{-9}$ is achieved after one Turbo Code decoding iteration.

As one can see from the above, by augmenting Turbo Codes with an error detection capability, the number of iterations necessarily for decoding Turbo Codes can be significantly reduced, thereby shortening decoding latency by six-folds or more in many practical applications.

The above detailed description is provided to illustrate the specific embodiments of the present invention and is not intended to be limiting. Numerous modification and variations of the present invention is possible within the scope of the present invention. The present invention is set forth in the following claims.

We claim:

1. A method for decoding an encoded message in an analog signal received at a receiver to obtain a decoded message, wherein the encrypted encoded message is (i) encoded according to an error detection scheme, (ii) further encoded in Turbo Codes, and (iii) modulated for transmission as a plurality of analog values in the analog signal; the method for decoding comprising:
   (i) based on channel condition, determining a required number of iterations necessary to achieve a predetermined bit error rate in the decoded message;
   (ii) demodulating the analog signal to recover the Turbo Codes-encoded message;
   (iii) iteratively decoding the Turbo Codes-encoded message for a predetermined number of iterations that is less than the required number of iterations to obtain a current result, wherein the iterative decoding is performed in conjunction with evaluating a probability that the current result corresponds to a correctly received message, the probability relating to the deviation of the analog values in the analog signal received from their corresponding values at transmission; and
   (iv) (a) applying the error detection scheme to determine from the current result whether or not the message has been successfully decoded; and (b) when the message is determined not to have been successfully decoded, returning to step (iii) of the method for decoding for further iterative decoding of the Turbo Codes-encoded message.

2. The method of claim 1, wherein the probability is substantially given by:

$$\sum_{i=1}^{L} \log \frac{P(Y_i - X_i \mid X_i)}{P(Y_i - X_i \mid X_i) + P(Y_i - \overline{X_i} \mid \overline{X_i})}$$

where (a) L is a length in number of bits of the Turbo Codes, (b) $X_i$ and $Y_i$ are one of analog values at transmission and its corresponding analog value in the analog signal received, respectively, and (c) $\overline{X}_i$ is an analog value representing either a mean or a complement of $X_i$.

3. The method of claim 1, wherein the predetermined number of iterations is one.

4. The method of claim 1 wherein, under the error detection scheme, the encoded message includes an error detection code, the method further comprising, prior to returning to step (ii), examining the error detection code in the current result to determine if it indicates that an error has not occurred during the transmission.

5. The method of claim 4, wherein a request for retransmission of the encoded message is sent when the error detection code indicates that an error has occurred during the transmission.

6. The method of claim 1, wherein the current result is used in a Turbo Code encoder to regenerate the Turbo Codes, and wherein the probability is computed based on the regenerated Turbo Codes.

7. The method of claim 4, wherein the error detection code is generated using the error detection scheme, which is part of an error correction scheme.

8. The method of claim 4, wherein the error detection code is based on cyclic redundancy check.

9. The method of claim 8, wherein the cyclic redundancy check is based on a generator polynomial given by:

$$g(x)=x^{10}+x^9+x^5+x^4+x+1.$$

10. A decoder for decoding an encoded message in an analog signal received at a receiver to obtain a decoded message, wherein the message is (i) encoded according to an error detection scheme, (ii) further encoded in Turbo Codes, and (iii) modulated for transmission as a plurality of analog values in the analog signal; the decoder comprising:
a demodulator that demodulates the analog signal to recover the Turbo Codes-encoded message; and
an iterative Turbo Code decoder that (i) based on channel condition, determines a required number of iterations necessary to achieve a predetermined bit error rate in the decoded message; (ii) provides a current result after a predetermined number of iterations of decoding the encoded message that is less than the required number; (iii) upon application of the error detection scheme on the current result, determines whether or not the encoded message has been successfully decoded; and (iv) returns to further iterative decoding of the encoded message when the encoded message is determined not to have been successfully decoded, wherein the iterative Turbo Code decoder operates in conjunction with evaluating a probability that the current result corresponds to a correctly received message, the probability relating to the deviation of the analog values in the analog signal received from their corresponding values at transmission.

11. The decoder of claim 10, wherein the probability is substantially given by:

$$\sum_{i=1}^{L} \log \frac{P(Y_i - X_i \mid X_i)}{P(Y_i - X_i \mid X_i) + P(Y_i - \overline{X}_i \mid \overline{X}_i)}$$

where (a) L is a length in number of bits of the Turbo Codes, (b) $X_i$ and $Y_i$ are one of analog values at transmission and its corresponding analog value in the analog signal received, respectively, and (c) $\overline{X}_i$ is an analog value representing either a mean or a complement of $X_i$.

12. The decoder of claim 10, wherein the predetermined number of iterations is one.

13. The decoder of claim 10 wherein, under the error detection scheme, the encoded message includes an error detection code, and wherein the iterative Turbo Code decoder, prior to returning to further iterative decoding, examines the error detection code in the current result, and stops further iterative decoding when the error detection code indicates that an error has not occurred during the transmission.

14. The decoder of claim 13, wherein a request for retransmission of the encoded message is sent when the error detection code indicates an error has occurred during the transmission.

15. The decoder of claim 13, wherein the further iterative decoding is carried out in the Turbo Code decoder when the error detection code fails to indicate that an error has occurred during transmission.

16. The decoder of claim 10, wherein the current result is used in a Turbo Code encoder to regenerate the Turbo Codes, and wherein the probability is computed based on the regenerated Turbo Codes.

17. The decoder of claim 13, wherein the error detection code is generated using the error detection scheme, which is part of an error correction scheme.

18. The decoder of claim 13, wherein the error detection code is based on cyclic redundancy check.

19. The decoder of claim 18, wherein the cyclic redundancy check is based on a generator polynomial given by:

$$g(x)=x^{10}+x^9+x^5+x^4+x+1.$$

20. In a receiver, a method for iteratively decoding an encoded message in an analog signal to achieve a decoded message, wherein
(i) the encoded message results from an encoding method that comprises:
including in the message an error decoding code, according to an error detection scheme;
encoding the message in Turbo Codes, and
modulating the encoded message for transmission to the receiver as a plurality of analog values in the analog signal; and
(ii) the method for iterative decoding comprises:
(a) based on channel condition, determining a required number of iterations necessary to achieve a predetermined bit error rate in the decoded message;
(b) after completing a predetermined number of iterations of the iterative decoding that is less than the required number of iterations, examining the error detection code to determine whether the error detection code indicates that no error has occurred during transmission; and
(c) when it is determined in the iteration that no error has occurred during the transmission, terminating the iterative decoding process.

21. The method of claim 20, wherein a request for retransmission of the message is sent when the error detection code indicates that an error has occurred during the transmission when the required number of iterations is reached.

22. The method of claim 20, wherein the error detection code is generated using an error correction scheme, of which the error detection scheme is part.

23. The method of claim 20, wherein the error detection code is based on cyclic redundancy check.

24. The method of claim 23, wherein the cyclic redundancy check is based on a generator polynomial given by:

$$g(x)=x^{10}+x^9+x^5+x^4+x+1.$$

25. The method of claim 20, wherein the required number of iterations is determined based on an indicator which value represents a probability that a message of a predetermined length is correctly received.

26. The method of claim 25, wherein the value of the indicator is evaluated taking into account both a probability of accepting the decoded as correct, when the decoded message in fact includes an error bit, and a probability of rejecting the decoded message as incorrect, even when no error bit is included in the decoded message.

27. The method of claim 25, wherein the value of the indicator is selected to be a threshold value above which the decoded message is accepted as correct and below which the decoded message is rejected as incorrect.

* * * * *